US010644477B2

(12) United States Patent
Miyata

(10) Patent No.: US 10,644,477 B2
(45) Date of Patent: May 5, 2020

(54) LIGHT SOURCE DEVICE

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/144,316

(22) Filed: Sep. 27, 2018

(65) Prior Publication Data
US 2019/0097381 A1   Mar. 28, 2019

(30) Foreign Application Priority Data
Sep. 28, 2017 (JP) .................. 2017-188528

(51) Int. Cl.
*H01S 5/00* (2006.01)
*H01S 5/022* (2006.01)
(Continued)

(52) U.S. Cl.
CPC .............. *H01S 5/005* (2013.01); *F21K 9/68* (2016.08); *F21V 7/0008* (2013.01); *F21V 7/05* (2013.01);
(Continued)

(58) Field of Classification Search
CPC . F21K 9/68; F21V 3/00; F21V 7/0008; F21V 7/05; F21Y 2115/30; H01S 5/005; H01S 5/02236
See application file for complete search history.

(56) References Cited

U.S. PATENT DOCUMENTS 7,518,155 B2 * 4/2009 Ishidu ............... H01L 33/60
257/79
8,242,518 B2 * 8/2012 Lerman ............ H01L 25/0753
257/88
(Continued)

FOREIGN PATENT DOCUMENTS

| JP | 2004289106 A | 10/2004 |
| JP | 2004296792 A | 10/2004 |
| JP | 2010092973 A | 4/2010 |

*Primary Examiner* — Peggy A Neils
(74) *Attorney, Agent, or Firm* — Hunton Andrews Kurth LLP

(57) ABSTRACT

There is provided a light source device comprising a substrate; a semiconductor laser placed on the substrate; a side wall portion formed so as to surround the semiconductor laser; and a cover being translucent, configured to cover a space surrounded by the substrate and the side wall portion, wherein the side wall portion includes a lower surface connected to an upper surface of the substrate over a whole periphery, an upper surface connected to a lower surface of the cover over a whole periphery, and inner side surfaces inclined so that the space expands from a lower surface side to an upper surface side of the side wall portion, at least a part of the inner side surfaces serving as a reflection surface for reflecting a beam emitted from the semiconductor laser toward the cover, and a connecting portion where an upper surface of the substrate and a lower surface of the side wall portion are in contact with each other via a connecting layer is provided in a region corresponding to an upper surface of the side wall portion in a plan view from above.

18 Claims, 8 Drawing Sheets

(51) Int. Cl.
    *F21K 9/68*           (2016.01)
    *F21V 7/05*           (2006.01)
    *F21V 7/00*           (2006.01)
    *F21Y 115/30*        (2016.01)
    *F21V 3/00*           (2015.01)
    *H01S 5/40*           (2006.01)

(52) U.S. Cl.
    CPC ...... *H01S 5/02236* (2013.01); *H01S 5/02292* (2013.01); *F21V 3/00* (2013.01); *F21Y 2115/30* (2016.08); *H01S 5/0222* (2013.01); *H01S 5/02216* (2013.01); *H01S 5/4031* (2013.01)

(56) References Cited

U.S. PATENT DOCUMENTS

| | | | | |
|---|---|---|---|---|
| 8,975,098 B2* | 3/2015 | Matsumura | ............ | H01L 33/40 257/13 |
| 9,818,923 B2* | 11/2017 | Ueda | ............ | H01L 33/62 |
| 2008/0142829 A1* | 6/2008 | Negley | ............ | H01L 33/58 257/98 |
| 2017/0307179 A1* | 10/2017 | Takagi | ............ | G03B 21/14 |

* cited by examiner

LIGHT SOURCE DEVICE

CROSS-REFERENCE TO RELATED APPLICATION

This application claims priority to Japanese Patent Application No. 2017-188528, filed on Sep. 28, 2017, the disclosure of which is hereby incorporated by reference in its entirety.

BACKGROUND

(1) Field of the Invention

The present disclosure relates to a light source device, particularly to a light source device including a semiconductor laser.

(2) Description of Related Art

In recent years, light source devices including light emitting elements such as semiconductor lasers and light emitting diodes have been widely used. Among them, there has been proposed a light source device including a reflection surface inclined with respect to the upper surface of a substrate on which the light emitting element is placed, and the reflection surface is placed so as to surround the light emitting element.

SUMMARY

In the light source device described in Japanese Patent Laid-open Publication No. 2010-92973, a side wall portion (outer frame) including a reflection surface is connected to a substrate via an adhesive layer. However, when the temperature of the light source device becomes high as in the case of using a semiconductor laser as a light emitting element, in some cases, it is preferable to perform a connection without using an adhesive agent from the viewpoint of stability of the structure. The connection without using an adhesive agent includes solid phase diffusion connection between metal layers, and in that case, it is necessary to apply a large compressive load from the lower surface side of the substrate and the upper surface side of the side wall portion.

In the light source device described in Japanese Patent Laid-open Publication No. 2010-92973, since the side wall portion includes a reflection surface inclined with respect to the upper surface of the substrate, the lower surface of the side wall portion has a region larger than the upper surface. Therefore, when a compressive load is applied from the lower surface side of the substrate and the upper surface side of the side wall portion, there is a region which is not supported from the upper surface side in the lower surface of the side wall portion.

Therefore, if solid phase diffusion connection is assumed to be performed in the light source device described in Japanese Patent Laid-open Publication No. 2010-92973, when a compressive load is applied from the lower surface side of the substrate and the upper surface side of the side wall portion, a bending moment may occur in a region not supported from the upper surface side, and a bending stress may be applied to the substrate and the side wall portion, so that warping and bending may occur.

One object of the present disclosure is to provide a light source device in which a substrate and a side wall portion having an inner side surface inclined with respect to the upper surface of the substrate are connected to each other, and the occurrence of warping and bending in the substrate and the side wall portion may be suppressed even when a compressive load is applied from the lower surface side of the substrate and the upper surface side of the side wall portion.

In an embodiment of the present invention, a light source device comprises a substrate, a semiconductor laser placed on the substrate, a side wall portion formed so as to surround the semiconductor laser, and a cover being translucent, configured to cover a space surrounded by the substrate and the side wall portion. The side wall portion includes a lower surface connected to an upper surface of the substrate over a whole periphery, an upper surface connected to a lower surface of the cover over a whole periphery, and inner side surfaces inclined so that the space expands from a lower surface side to an upper surface side of the side wall portion, and at least a part of the inner side surfaces serves as a reflection surface for reflecting a beam emitted from the semiconductor laser toward the cover. A connecting portion where an upper surface of the substrate and a lower surface of the side wall portion are in contact with each other via a connecting layer is provided in a region corresponding to an upper surface of the side wall portion in a plan view from above.

In the above light source device, the occurrence of warping and bending in the substrate and the side wall portion may be suppressed even when a compressive load is applied from the lower surface side of the substrate and the upper surface side of the side wall portion.

DETAILED DESCRIPTION OF PREFERRED EMBODIMENTS

Figure 1:
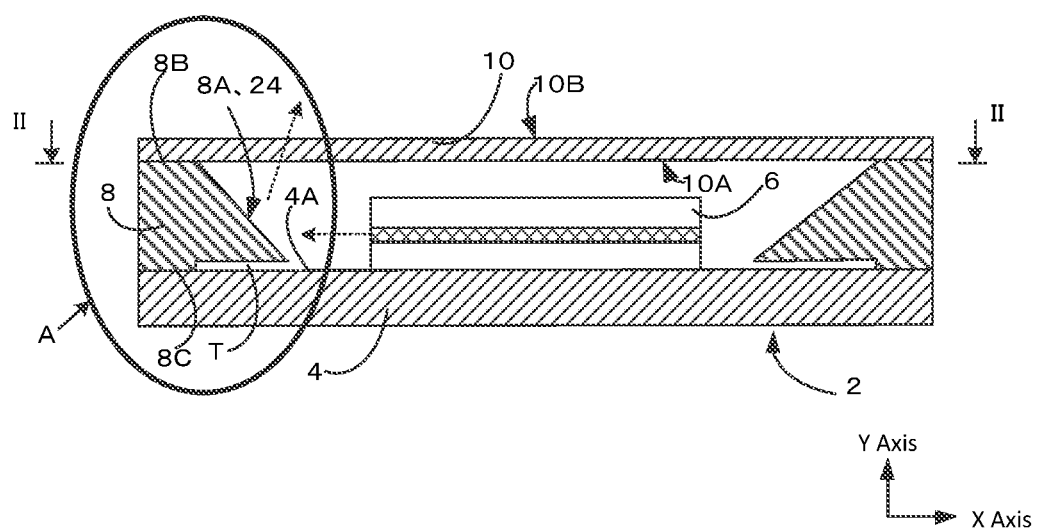
FIG. 1 is a schematic side sectional view showing the outline of a light source device according to an embodiment of the present invention.

Hereinafter, various embodiments for implementing the present invention will be described with reference to the drawings. Corresponding members having the same function in each drawing are denoted by the same reference numerals. In consideration of the description of the points or ease of understanding, embodiments are shown separately for convenience, but partial substitutions or combinations of configurations shown in different embodiments are possible. In and after the second embodiment (other embodiments), descriptions of items common to those in the first embodiment (one embodiment) are omitted, and only different points will be described. In particular, the same action and effect with the same configuration will not be referred to sequentially in each embodiment.

The following description is made on the premise that the substrate is placed on a horizontal plane, the substrate is placed on the lower side, and the cover is placed on the upper side. In particular, the horizontal direction from the left to the right in the drawing is shown as the X axis+ direction, and the vertical direction from the bottom to the top in the drawing is shown as the Y axis+ direction.

(Light Source Device According to an Embodiment)

Figure 2:
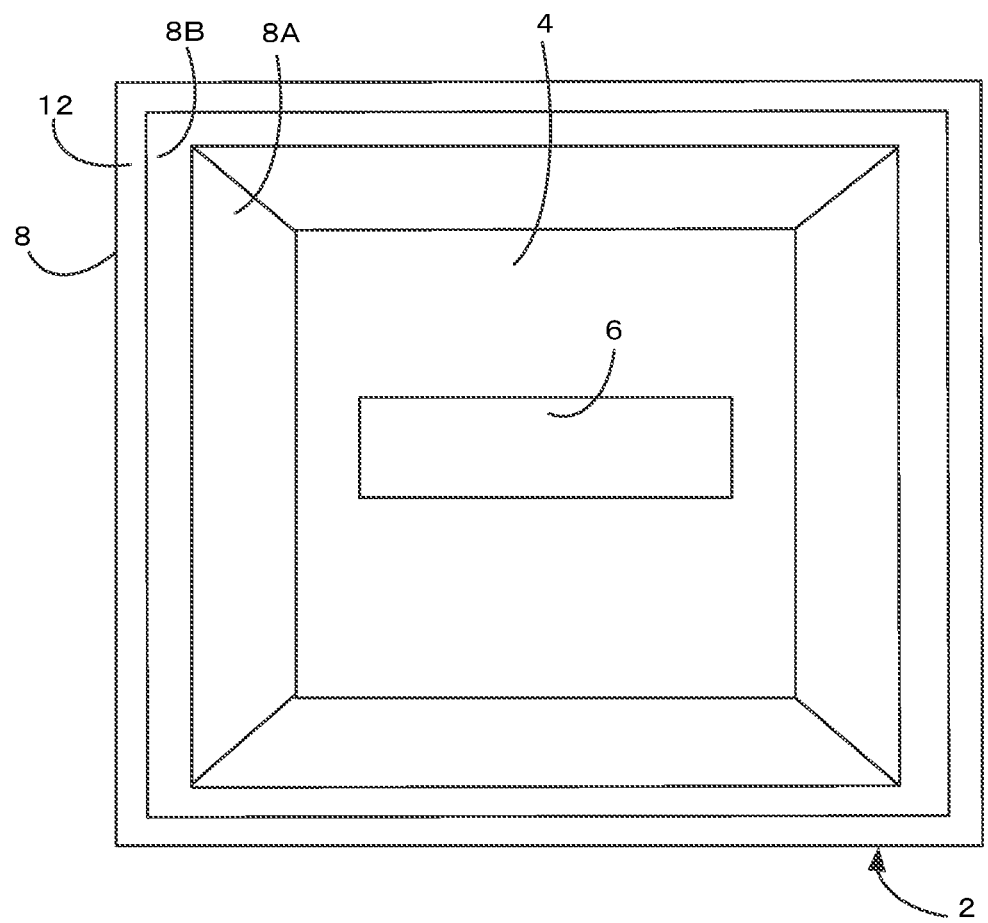
FIG. 2 is a view taken along line II-II in FIG. 1, and is a plan view showing a case of including one semiconductor laser.
Figure 3:
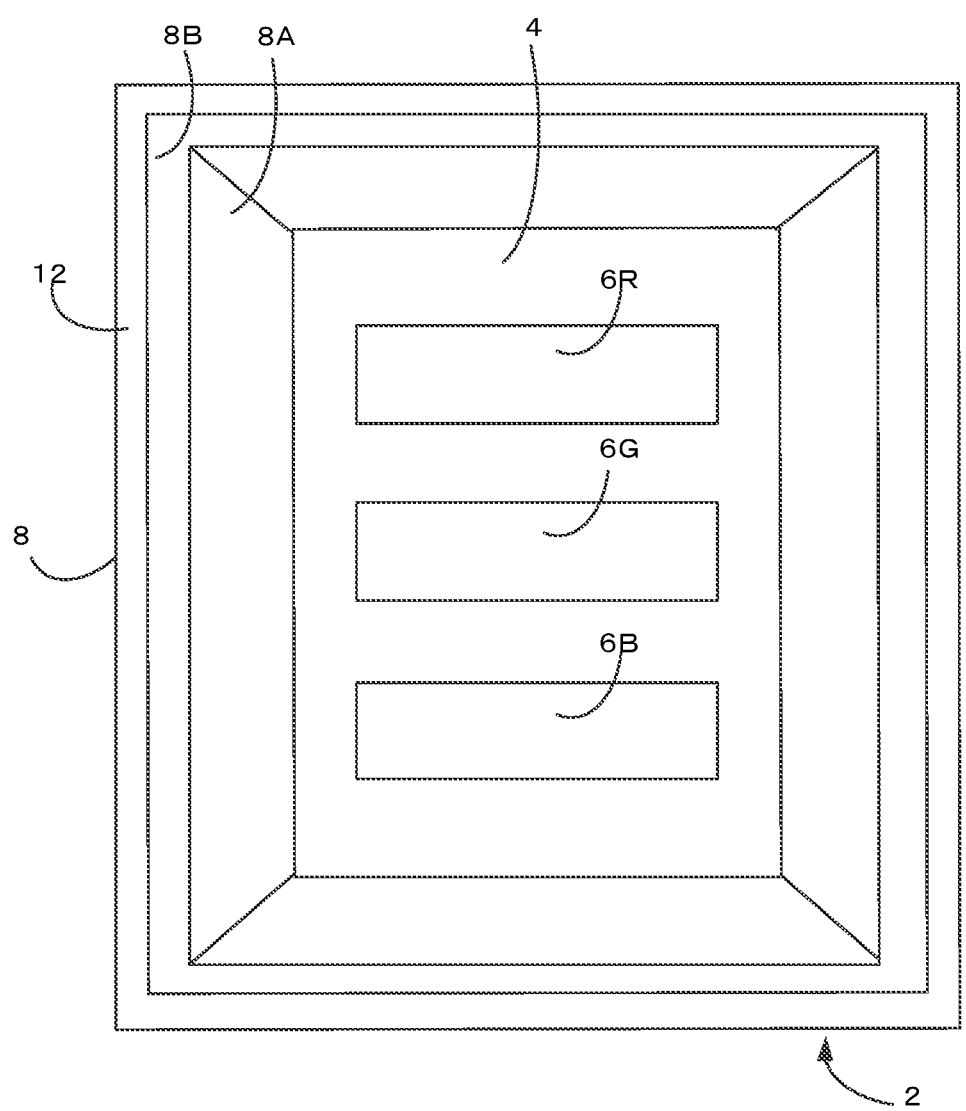
FIG. 3 is a view taken along line II-II in FIG. 1, and is a plan view showing a case of including a plurality of semiconductor lasers.

First, the outline of a light source device according to an embodiment of the present invention will be described with reference to FIGS. 1, 2, and 3. FIG. 1 is a schematic side sectional view showing the outline of a light source device according to an embodiment of the present invention. FIG. 2 is a view taken along line II-II in FIG. 1 (plan view), and is a plan view showing a case of including one semiconductor laser 6. FIG. 3 is a view taken along line II-II in FIG. 1, and is a plan view showing a case of including a plurality of semiconductor lasers 6R, 6G, and 6B.

The light source device 2 according to the present embodiment comprises: a substrate 4; a semiconductor laser 6 (6R, 6G, and 6B) placed on an upper surface of the substrate 4; a side wall portion 8 formed so as to surround the semiconductor laser 6 (6R, 6G, and 6B); and a cover 10, being translucent, for covering a space surrounded by the substrate 4 and the side wall portion 8. The side wall portion 8 includes a lower surface 8C serving as a connection surface with the substrate 4, and an inclined surface 8A being an inner side surface inclined with respect to an upper surface 4A of the substrate 4. On the inclined surface 8A, a reflection film, constituting a reflection surface 24, for reflecting the beam emitted from the semiconductor laser 6 in the direction of the cover 10 (see the dotted arrow in FIG. 1) is formed. It should be noted that the beam reflected in the direction of the cover 10 means a reflected beam traveling in any direction including a vertically upward vector component directed toward the cover.

An upper surface 8B of the side wall portion 8 is airtightly connected over the entire periphery thereof to a lower surface 10A of the cover 10. Similarly, the lower surface 8C of the side wall portion 8 is airtightly connected over the entire periphery thereof to the upper surface 4A of the substrate 4. It should be noted that as will be described below, a recess T is provided on the lower surface 8C side of the side wall portion 8 or the upper surface 4A side of the substrate 4. In the embodiment shown in FIG. 1, the recess T is provided on the lower surface 8C side of the side wall portion 8. Thus, in a region where the recess T is not provided, the lower surface 8C of the side wall portion 8 and the upper surface 4A of the substrate 4 are connected to each other.

With this connecting structure, the semiconductor laser 6 (6R, 6G, and 6B) mounted in a package constituted by the substrate 4 and the side wall portion 8 may be hermetically sealed with the cover 10. Therefore, it is possible to provide a light source device 2 capable of taking out the beam from the cover 10 with improved durability by hermetically sealing the semiconductor laser 6 (6R, 6G, and 6B). It should be noted that for hermetic sealing, conventionally well-known inert gas, gas containing at least oxygen, or dry air may be used. In particular, when a nitride-based semiconductor element is used, it is preferable to use dry air or gas containing at least oxygen because degradation is prevented.

As the semiconductor laser 6 shown in FIG. 2, for example, it is conceivable to use a nitride semiconductor laser with oscillation wavelengths from ultraviolet to green regions, and furthermore, it is also possible to create beams with longer wavelengths for mixing colors by wavelength conversion using a fluorescent material. However, the present disclosure is not limited thereto, and a semiconductor laser of a red or infrared region may be used as the semiconductor laser 6.

As the semiconductor laser 6R shown in FIG. 3, a GaAs-based semiconductor laser having an oscillation wavelength of a red or infrared region is used, as the semiconductor laser 6G, a nitride semiconductor laser having an oscillation wavelength of a green region is used, and as the semiconductor laser 6B, a nitride semiconductor laser having an oscillation wavelength of ultraviolet light or a blue region is used. Thus, it is possible to provide a light source device 2 which is applicable to various applications and in which a plurality of semiconductor lasers 6R, 6G, and 6R are hermetically sealed.

As shown in FIGS. 2 and 3, in a plan view of the package viewed from above, the substrate 4 for constituting the package has a substantially rectangular shape. In the side wall portion 8, four inclined surfaces 8A for constituting, together with the substrate 4, a recessed structure in which the semiconductor laser 6 (6R, 6G, and 6B) is stored are formed. The four upper sides serving as the boundary between the inclined surfaces 8A and the upper surface 8B of the side wall portion 8 form a substantially rectangular shape. Similarly, the four lower sides serving as the boundary between the inclined surfaces 8A of the side wall portion 8 and the substrate 4 form a substantially rectangular shape. Therefore, with the substrate 4 and the four inclined surfaces 8A of the side wall portion 8, a substantially truncated quadrangular pyramidal recess whose lower side is shorter than the upper side and is narrowed is formed.

In the present embodiment, since the side wall portion 8 is formed so as to surround the semiconductor laser 6 (6R, 6G, and 6B), and the reflection surfaces 24 formed on the inclined surfaces 8A are formed so as to surround the semiconductor laser 6, it is possible to efficiently reflect the beam emitted from the semiconductor laser 6 and improve the beam extraction efficiency. In addition, since the side wall portion 8 including the reflection surface 24 also functions as a part of the package, the light source device 2 may be downsized.

In the present embodiment, a substantially truncated quadrangular pyramidal recess is formed with the substrate 4 having a substantially rectangular shape in a plan view and the four inclined surfaces 8A of the side wall portion 8, but the present disclosure is not limited thereto, and a recess in a shape of a truncated triangular pyramid, any truncated polygonal pyramid such as a truncated pentagonal pyramid or more, or a truncated conical recess may also be used. The plan view shape of the substrate 4 may also be a square, a triangle, a polygon with a pentagon or more, or a circle. In addition, in the present embodiment, the side wall portion 8 is formed on the outer edge side of the substrate 4, and the outer shape of the substrate 4 and the outer shape of the side wall portion 8 are coincident with each other, but the present disclosure is not limited thereto. As long as the side wall portion 8 is formed so as to surround the semiconductor laser 6, the substrate 4 may extend further to the outside of the outer shape of the side wall portion 8. In addition, a plurality of side wall portions 8 may be formed on one substrate 4.

In the present embodiment, since the substrate 4 and the side wall portion 8 are formed of individual members, optimal materials corresponding to the respective uses may be adopted.

In the present embodiment, the substrate 4 is formed of a ceramic material such as aluminum nitride, alumina, alumina zirconia, and silicon nitride. Forming the substrate of a ceramic material may obtain an insulating substrate excellent in cost, strength, and insulation. In particular, using a ceramic material may easily form conductive vias on the substrate with airtightness.

However, the material of the substrate 4 is not limited to a ceramic material. Silicon, a resin material, other single crystals, and a metal material including an insulating layer may also be used.

In the present embodiment, the side wall portion 8 is formed of silicon. In this case, when a reflection surface having an accurate inclination angle, for example, a <100> plane of single crystal silicon, is etched by anisotropic etching, a <111> plane having an angle of 54.7° appears, and this may serve as the inclined surface 8A. In the present embodiment, since the side wall portion 8 is formed of silicon, a reflection surface having a desired inclination angle with high accuracy may be formed.

Furthermore, in the four inclined surfaces 8A, it is preferable that the plane) on which the beam emitted from the semiconductor laser is directly incident is cut out such that the upper surface 8B and the lower surface 8C of the side wall portion 8 form an angle of 9.7° with respect to the <100> plane so as to be at an angle of 45° with respect to the upper surface 4A of the substrate 4. Thus, since a reflection surface having an inclination angle of exactly 45° with respect to the upper surface 4A of the substrate 4 may be obtained, the beam emitted from the semiconductor laser 6 may be reflected in the direction accurately perpendicular to the upper surface 4A of the substrate 4.

In this case, in the four inclined surfaces 8A, the surfaces other than the surface on which the beam emitted from the semiconductor laser 6 is directly incident have inclination angles different from 45° with respect to the upper surface 4A of the substrate 4. In other words, in the side wall portions 8A, the inclination angle with respect to the upper surface 4A of the substrate 4 has a difference between the surface on which the beam emitted from the semiconductor laser 6 is directly incident and the other surfaces.

However, the material of the side wall portion 8 is not limited to silicon, and a resin material, another ceramic material, a metal including an insulating layer, or glass may be used.

As the material of the translucent cover 10, translucent glass is used in the present embodiment, but the present disclosure is not limited thereto, and quartz or sapphire may also be used.

(Connecting Structure of Side Wall Portion According to Present Disclosure)

Next, with reference to FIGS. 4A and 4B, a connecting structure using solid phase diffusion connection of the side wall portion 8 according to the present disclosure will be described. In order to connect the substrate 4 (104) and the side wall portion 8 (108) by solid phase diffusion connection using a connecting layer made of a metal material, a compressive load is applied from the lower surface 4B (104B) side of the substrate 4 (104) and the upper surface 8B (108B) side of the side wall portion 8 (108) via the cover 10 (110).

Figure 4A:
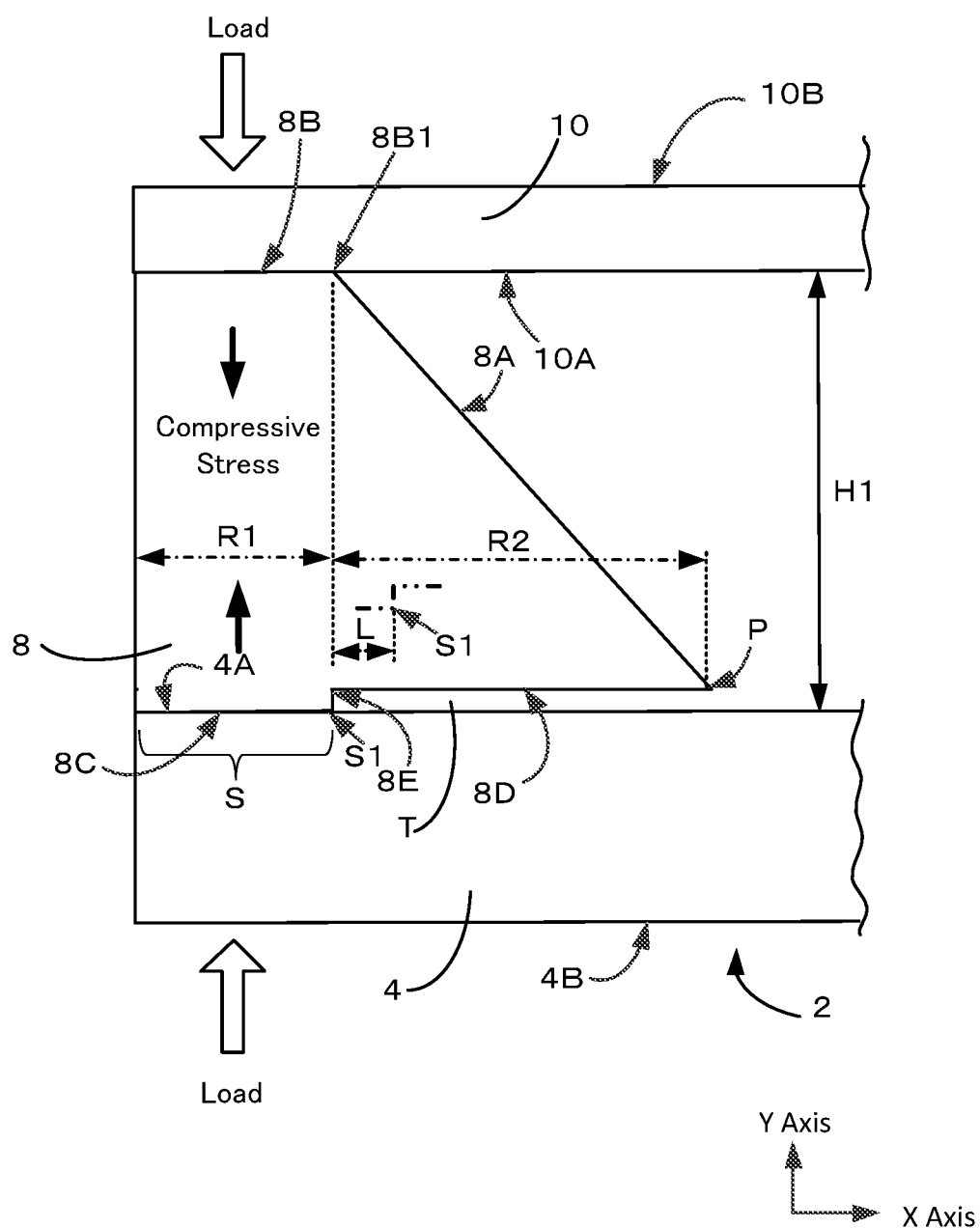
FIG. 4A is a side sectional view schematically showing a state in which a compressive load is applied from the lower surface side of the substrate and the upper surface side of the side wall portion via the cover in order to connect the substrate and the side wall portion to each other via the connecting layer in the connecting structure of the side wall portion according to the present disclosure.

FIG. 4A is a side sectional view schematically showing a state in which a compressive load is applied from the lower surface 4B side of the substrate 4 and the upper surface 8B side of the side wall portion 8 via the cover 10 in order to connect the substrate 4 and the side wall portion 8 to each other via the connecting layer in the connecting structure of the side wall portion 8 according to the present disclosure. FIG. 4B is a side sectional view schematically showing a state in which a compressive load is applied from the lower surface 104B side of the substrate 104 and the upper surface 108B side of the side wall portion 108 via the cover 110 in order to connect the substrate 104 and the side wall portion 108 to each other via the connecting layer in the conventional connecting structure of the side wall portion 108.

The solid phase diffusion connection means a method of connection by utilizing the diffusion of atoms generated between the connecting surfaces by pressurizing the base material in close contact. In FIGS. 4A and 4B, hollow arrows schematically showing that loads are applied are shown at the center position of the surface for receiving load.

In the present embodiment, as shown in FIG. 4A, in a plan view from above (Y axis minus direction), a recess T formed with the recessed plane 8D and the recessed side surface 8E is provided in the other region R2 corresponding to the inclined surface 8A on the lower surface side of the side wall portion 8. Therefore, in a plan view from above (Y axis minus direction), the lower surface of the side wall portion 8 is formed with a lower surface 8C provided in a region R1 corresponding to the upper surface 8B of the side wall portion 8 and the recessed plane 8D provided in the other region R2 corresponding to the inclined surface 8A. The lower surface 8C of the side wall portion 8 and the upper surface 4A of the substrate 4 come into contact with each other to form a connecting portion S. That is, the connecting portion S where the upper surface 4A of the substrate 4 and the lower surface 8C of the side wall portion 8 are in contact with each other is formed in the region R1 corresponding to the upper surface 8B of the side wall portion 8.

As will be described below, the recess T may be provided on the upper surface 4A side of the substrate 4. In any case, the connecting portion S where the upper surface 4A of the substrate 4 and the lower surface 8C of the side wall portion 8 are in contact with each other is provided in the region R1 corresponding to the upper surface 8B of the side wall portion 8 on the whole periphery.

In the present embodiment, since the connecting portion S is provided in the region R1 corresponding to the upper surface 8B of the side wall portion 8, even when a compressive load is applied from the lower surface 4B side of the substrate 4 and the upper surface 8B side of the side wall portion 8 via the cover 10 in order to connect the upper surface 4A of the substrate 4 and the lower surface 8C of the side wall portion 8, only the compressive stress in the vertical direction is applied to the substrate 4 and the side wall portion 8, so that there is little possibility that warping and bending occur in the substrate 4 and the side wall portion 8.

Figure 4B:
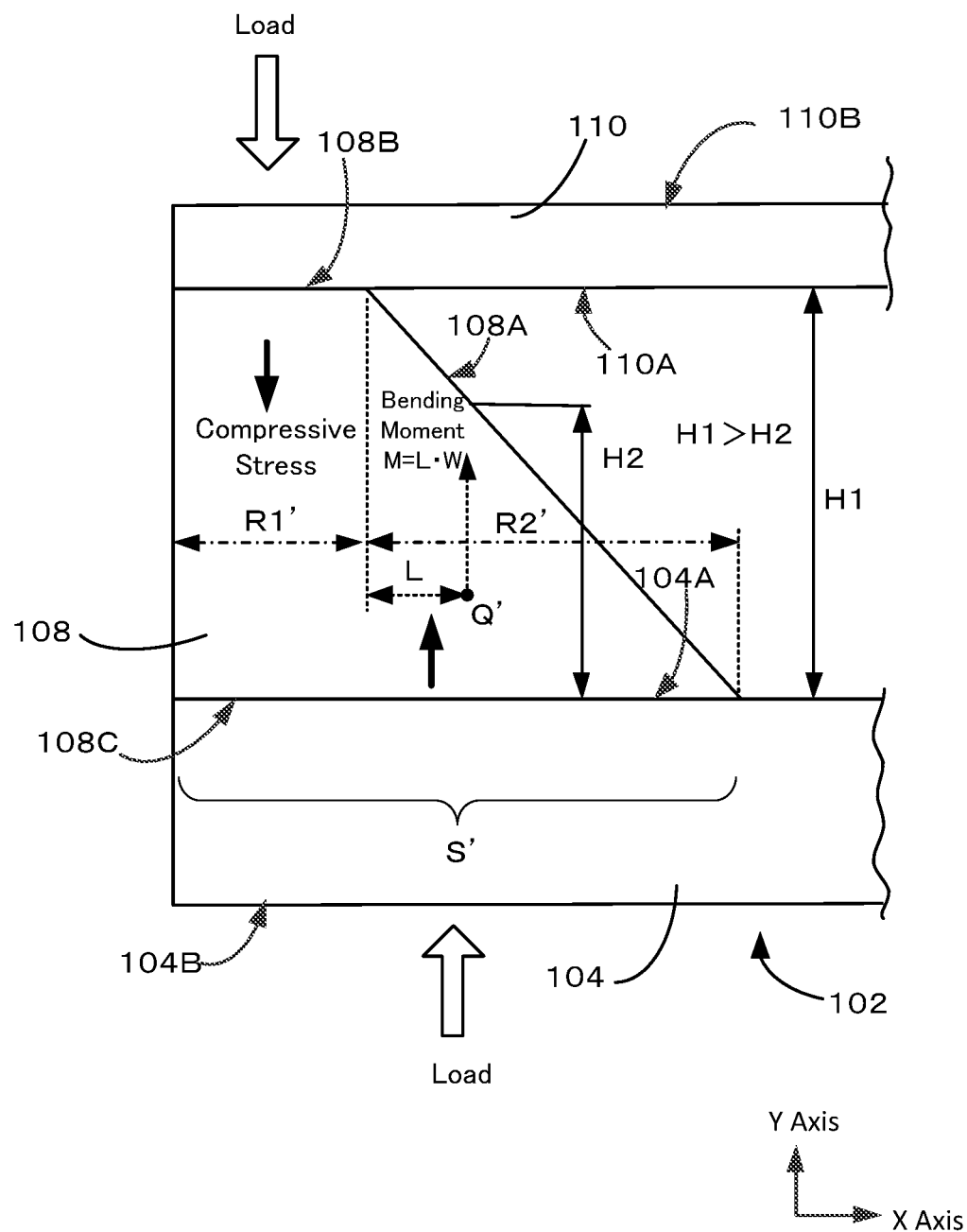
FIG. 4B is a side sectional view schematically showing a state in which a compressive load is applied from the lower surface side of the substrate and the upper surface side of the side wall portion via the cover in order to connect the substrate and the side wall portion to each other via the connecting layer in the conventional connecting structure of the side wall portion.

On the other hand, in the connecting structure of the conventional side wall portion 108, as shown in FIG. 4B, the connecting portion S' is present not only in the region R1' corresponding to the upper surface 108B of the side wall portion 108, but also in the other region R2' corresponding to the inclined surface 108A being the inclined surface.

In such a case, as schematically shown in FIG. 4B, at the point Q' apart from the boundary between the region R1' and the other region R2' by the distance L in the X axis plus direction, if the component force due to the compressive load at that point is denoted by W, a bending moment of M=L×W is applied. That is, when a load is also applied to the other region R2' corresponding to the inclined surface 108A, bending stress is applied to the substrate 104 and the side wall portion 108, and there is a possibility that warping and bending occur in the substrate 104 and the side wall portion 108.

Furthermore, since the height dimension H2 of the side wall portion 108 in the other region R2' is smaller than the height dimension H1 of the side wall portion 108, the side wall portion 108 is weak in strength, and the possibility of deformation of the substrate 104 and the side wall portion 108 is increased.

As described above, in the embodiment of the present disclosure, since the connecting portion S where the upper surface 4A of the substrate 4 and the lower surface 8C of the side wall portion 8 are in contact with each other via the connecting layer is provided in the region R1 corresponding to the upper surface 8B of the side wall portion 8 on the whole periphery in a plan view from above, even when a compressive load is applied from the lower surface 4B side of the substrate 4 and the upper surface 8B side of the side wall portion 8, the occurrence of warping and bending in the substrate 4 and the side wall portion 8 may be suppressed.

In particular, when the connecting portion S where the upper surface 4A of the substrate 4 and the lower surface 8C of the side wall portion 8 are in contact with each other via the connecting layer as shown in FIG. 4A is provided only in the region where the upper surface 8B of the side wall portion 8 is positioned in a plan view from above, the possibility of the occurrence of warping and bending in the substrate 4 and the side wall portion 8 may be particularly effectively suppressed. In addition, even if the region where the upper surface 8B of the side wall portion 8 is in contact with the cover 10 is smaller than the whole surface of the upper surface 8B, since there is no possibility that a large bending stress occurs when a load is applied, the occurrence of warping and bending of the substrate 4 and the side wall portion 8 may be suppressed.

Furthermore, in order to perform solid phase diffusion connection between the cover and the substrate, it is necessary to apply a compressive load to the upper surface 10B of the cover 10 and the lower surface 4B of the substrate 4 by heating, but as described above, there is little possibility of warping and bending in the substrate 4 and the side wall portion 8, and solid-phase diffusion connection may achieve airtight and firm connection between the substrate 4 and the side wall portion 8.

Regarding the "region R1 corresponding to the upper surface 8B of the side wall portion 8" in a plan view from above, there may be not only a case where the region R1 is substantially the same as the "region where the upper surface 8B of the side wall portion 8 is positioned", but also a case where the region R1 is a region smaller than the "region where the upper surface 8B of the side wall portion 8 is positioned" within the "region where the upper surface 8B of the side wall portion 8 is positioned". Furthermore, within the range substantially exhibiting the above action and effect, there may also be a case where the region R1 partially includes a region adjacent to the "region where the upper surface 8B of the side wall portion 8 is positioned".

For example, in a plan view from above, assuming that the distance between the end portion S1 on the inner side surface (inclined surface) 8A side of the connecting portion S and the end portion 8B1 on the inner side surface (inclined surface) 8A side of the region where the upper surface 8B of the side wall portion 8 is positioned is L (see the imaginary line (two-dot chain line) part in FIG. 4A), and assuming that the height of the side wall portion 8 is H1, when the length of L with respect to the height H1 is 0.4 or less, that is, when the angle formed by the two sides connecting the upper portion of H1 and the end portions of L is smaller than 25°, the bending moment described with reference to FIG. 4B is also far from a large value. And the decrease in strength due to the reduction in the height dimension H2 of the side wall portion is also considered to be small.

Accordingly, when the relationship L/H≤0.4 is satisfied, the occurrence of warping and bending in the substrate and the side wall portion may be considered to be sufficiently suppressed.

Figure 6:
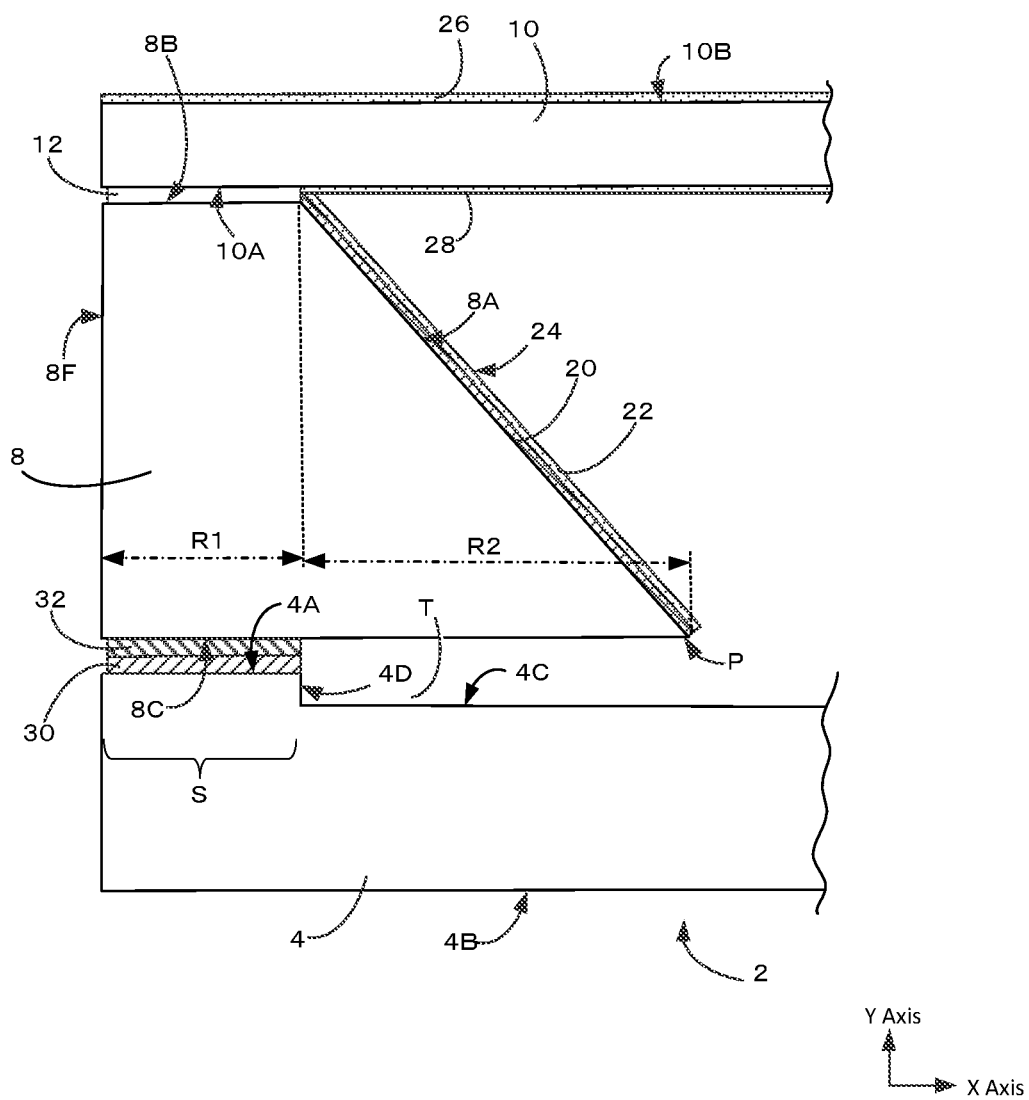
FIG. 6 is an enlarged side sectional view showing a region indicated by A in FIG. 1, and is a view showing a connecting structure of a side wall portion according to a second embodiment of the present invention.

It should be noted that in FIG. 4A, the recess T is provided on the lower surface side of the side wall portion 8, but the present disclosure is not limited thereto, and as described below with reference to FIG. 6, the same action and effect are obtained even when the recess T is provided on the substrate 4 side. Furthermore, the same action and effect are obtained even when recesses are provided on both the lower surface side of the side wall portion 8 and the upper surface side of the substrate 4.

(Connecting Structure of Side Wall Portion According to First Embodiment)

Figure 5:
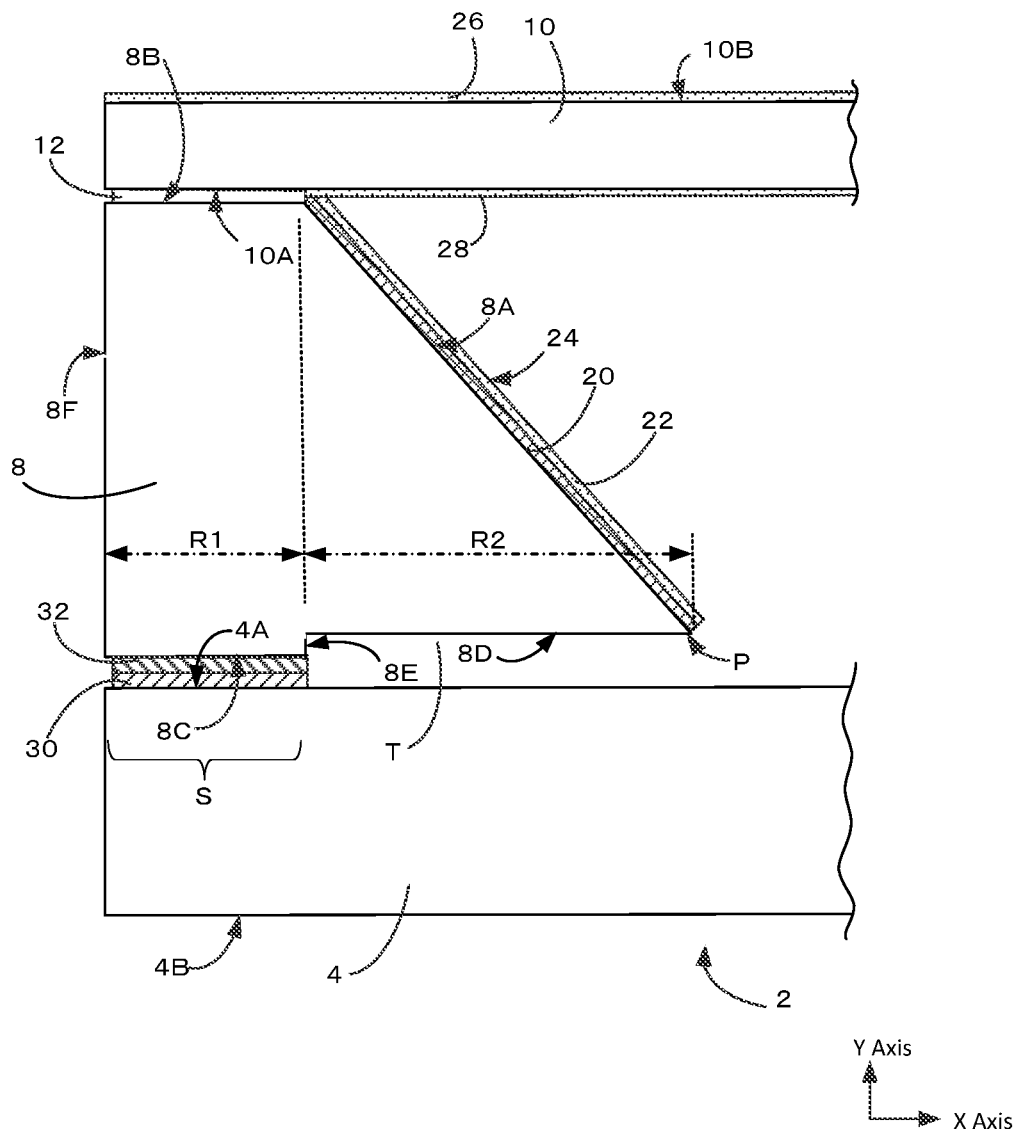
FIG. 5 is an enlarged side sectional view showing a region indicated by A in FIG. 1, and is a view showing a connecting structure of a side wall portion according to a first embodiment of the present invention.

Next, referring to FIG. 5, the connecting structure of the side wall portion according to the first embodiment of the present invention will be described. FIG. 5 is an enlarged side sectional view showing a region indicated by A in FIG. 1, and is a view showing a connecting structure of a side wall portion according to a first embodiment of the present invention.

As compared with FIG. 1, FIG. 5 further shows:

(1) a first connecting layer 30 (substrate side) and a second connecting layer 32 (side wall portion side) being connecting layers used for airtightly connection the substrate 4 and the side wall portion 8, (2) a first reflection film 20 being a metal film and a second reflection film 22 being a dielectric film, formed for making the inclined surface 8A of the side wall portion 8 perform as the reflection surface 24, and (3) a connecting layer 12 for anodically bonding the upper surface 8A of the side wall portion 8 and the lower surface 10A of the cover 10.

<Connection of Substrate and Side Wall Portion>

In the present embodiment, a recess T formed of the recessed plane 8D and the recessed side surface 8E is provided on the lower surface side of the side wall portion 8. Therefore, in a plan view from above (Y axis minus direction), the lower surface side of the side wall portion 8 is formed with a lower surface 8C provided in a region R1 corresponding to the upper surface 8B of the side wall portion 8 and the recessed plane 8E provided in a region R2 corresponding to the inclined surface 8A. The upper surface 4A of the substrate 4 and the lower surface 8C of the side wall portion 8 are in contact with each other to form a connecting portion S. That is, the connecting portion S where the upper surface 4A of the substrate 4 and the lower surface 8C of the side wall portion 8 are in contact with each other is formed in the region R1 corresponding to the upper surface 8B of the side wall portion 8. The width of the connecting portion S is preferably 0.1 mm or more, and more preferably 0.35 mm or more. The height of the connecting portion S, that is, the recessed amount of the recess T is preferably 0.1 to 50 µm, and more preferably 1 to 20 µm.

In the present embodiment, a first connecting layer 30 being a metal film is formed, in a region opposite to the lower surface 8C of the side wall portion 8, on the upper surface 4A of the substrate 4, and a second connecting layer 32 being a metal film is formed on the lower surface 8C of the side wall portion 8. Then, applying a compressive load from the lower surface 4B side of the substrate 4 and the upper surface 8B side of the side wall portion 8 via the cover 10 may connect the first connecting layer 30 and the second connecting layer 32 by solid phase diffusion connection. Even when a compressive load is applied from the lower surface 4B side of the substrate 4 and the upper surface 8B side of the side wall portion 8 during solid phase diffusion connection, the occurrence of warping and bending in the substrate 4 and the side wall portion 8 may be suppressed.

As the first connecting layer 30 formed on the upper surface 4A of the substrate 4, a laminated film composed of a layer formed of a first layer made of a film containing any one of titanium (Ti), nickel (Ni), and chromium (Cr) and a second layer made of a film containing platinum (Pt) (there may be no second layer), and a third layer made of a film containing gold (Au) located thereon (connecting layer) may be exemplified.

As the second connecting layer 32 formed on the lower surface 8C of the side wall portion 8, similarly to the first connecting layer 30, a laminated film composed of a layer formed of a first layer made of a film containing any one of titanium (Ti), nickel (Ni), and chromium (Cr) and a second layer made of a film containing platinum (Pt) (there may be no second layer), and a third layer made of a film containing gold (Au) located thereon (connecting layer) may be exemplified.

It should be noted that the total thickness of these connecting layers 30 and 32 may be, for example, about 0.3 to 2 µm.

In the first connecting layer 30, the third layer (connecting layer) may be adequately connected to the substrate 4 with the first layer and the second layer, and in the second connecting layer 32, the third layer (connecting layer) may be adequately connected to the side wall portion 8 with the first layer and the second layer. Then, since the third layer (connecting layer) of the first connecting layer 30 formed on the substrate 4 side and the third layer (connecting layer) of the second connecting layer 32 formed on the side wall portion 8 side are connected by solid phase diffusion between gold (Au) and gold (Au), firm connection between the substrate 4 and the side wall portion 8 may be achieved.

In the present embodiment, since the recess T is provided on the lower surface side of the side wall portion 8, even when dust is attached to a portion other than the connecting portion, the influence on the connection may be suppressed. In addition, since the position of the connecting portion S where the upper surface 4A of the substrate 4 and the lower surface 8C of the side wall portion 8 are in contact with each other is apart from the lower end portion P of the inclined surface 8A to be the reflection surface 24 of the side wall portion 8, the inclined surface 8A serving as the reflection surface 24 may be prevented from being damaged during connection.

Generally, the melting point of the lead-free solder often used for secondary mounting of the light source device 2 is about 220° C. Making the melting point after connection in the first connecting layer 30 and the second connecting layer 32 higher than the melting point of the solder used in the secondary mounting may obtain a stable and firm connecting structure of the substrate 4 and the side wall portion 8 for a long period without melting during the secondary mounting.

<Reflection Film>

On the inclined surface 8A of the side wall portion 8, a first reflection film (metal film) 20 composed of a first layer made of a film containing any one of titanium (Ti), nickel (Ni), and chromium (Cr) and a second layer made of a film containing platinum (Pt) (there may be no first layer or second layer), and a third layer (reflection layer) made of a film containing silver (Ag) located thereon is formed. The thickness of the first reflection film (metal film) 20 may exemplify about 0.3 to 2 µm.

In the present embodiment, since a film containing silver is formed as the first reflection film (metal film) 20, a reflection surface 24 with high reflectance may be obtained. The third layer is not limited to silver (Ag), and for example, a metal film containing aluminum (Al) may also be used.

In the present embodiment, a second reflection film 22 being a dielectric film made of silicon dioxide ($SiO_2$) or titanium dioxide ($TiO_2$) is further formed on the first reflection film (metal film) 20. The second reflective film (dielectric film) 22 may be a single layer or a multilayer film in which layers having different refractive indices are laminated. The second reflection film (dielectric film) 22 may perform as an excellent reflection film by suitably setting the material and film thickness to be laminated. Here, the reflectance of the reflection surface 24 may be effectively increased with the second reflection film (dielectric film) 22 performing as a reflection film.

In the present embodiment, the reflection film is formed of the first reflection film (metal film) 20 and the second reflection film (dielectric film) 22. Therefore, the outer surface of the second reflection film (dielectric film) 22 constitutes the reflection surface 24. However, the present disclosure is not limited thereto, and there may be a case where the dielectric film is not provided and the outer surface of the metal film constitutes the reflection surface, and may also be a case where the metal film is not provided either and the inclined surface itself of the side wall portion constitutes the reflection surface.

As described above, since a first reflection film (metal film) 20 containing silver (Ag) or aluminum (Al) and a second reflection film 22 being a dielectric film are provided on the inclined surface 8A of the side wall portion 8 as a reflection film, a reflection surface 24 with high reflectance may be obtained.

<Connection of Side Wall Portion and Cover>

Next, the connection of the upper surface 8B of the side wall portion 8 and the lower surface 10A of the cover 10 will be described.

In the present embodiment, the connecting layer 12 made of aluminum or an aluminum alloy is formed on the upper surface B of the side wall portion 8. In addition, an antireflection film (dielectric film) 26 is formed on the upper surface 10B of the cover 10. Furthermore, an antireflection film (dielectric film) 28 is formed in a region, excluding a region opposite to the upper surface 8B of the side wall portion 8, of the lower surface 10A of the cover 10.

Then, the connecting layer 12 and the lower surface 10A of the cover 10 are anodically bonded. The anodic bonding means a bonding in which ions present inside the glass are activated by bringing glass and metal or glass and silicon into contact to be heated, and then, a predetermined voltage is applied between both electrodes with the metal or silicon side, that is, the side wall portion 8 side as an anode, whereby the ions are moved to perform bonding. With this anodic bonding, materials with greatly different properties such as glass and metal, or glass and silicon may be bonded to each other without using an inclusion such as solder or an adhesive.

As described above, since the connecting layer 12 and the cover 10 are connected by anodic bonding, firm connection with high airtightness may be made.

(Description of Connecting Structure of Side Wall Portion According to Second Embodiment)

Next, referring to FIG. 6, the connecting structure of the side wall portion according to the second embodiment of the present invention will be described. FIG. 6 is an enlarged side sectional view showing a region indicated by A in FIG. 1, and is a view showing a connecting structure of a side wall portion according to a second embodiment of the present invention.

In the second embodiment, no recess is provided on the side wall portion 8 side, and the side wall portion 8 has a uniform lower surface 8C. On the other hand, on the upper surface side of the substrate 4, a recess T formed of the recessed plane 4C and the recessed side surface 4D is provided.

Therefore, in a plan view from above (Y axis minus direction), the upper surface side of the substrate 4 is formed with the upper surface 4A provided in a region R1 corresponding to the upper surface 8B of the side wall portion 8 and the recessed plane 4C provided in a region including the other region R2 corresponding to the inclined surface 8A. The upper surface 4A and the lower surface 8C of the side wall portion 8 are in contact with each other to form a connecting portion S. That is, the connecting portion S where the upper surface 4A of the substrate 4 and the lower surface 8C of the side wall portion 8 are in contact with each other is formed in the region R1 corresponding to the upper surface 8B of the side wall portion 8.

Also in the present embodiment, a first connecting layer 30 being a metal film is formed on the upper surface 4A of the substrate 4, and a second connecting layer 32 being a metal film is formed, in a region opposite to the upper surface 4A of the substrate 4, on the lower surface 8C of the side wall portion 8. Then, applying a compressive load from the lower surface 4B side of the substrate 4 and the upper surface 8B side of the side wall portion 8 may connect the first connecting layer 30 and the second connecting layer 32 by solid phase diffusion connection. Even when a compressive load is applied from the lower surface 4B side of the substrate 4 and the upper surface 8B side of the side wall portion 8 during solid phase diffusion connection, the occurrence of warping and bending in the substrate 4 and the side wall portion 8 may be suppressed.

In addition, in the present embodiment, the semiconductor laser is placed on the recessed plane 4C.

Since other matters including the first connecting layer 30, the second connecting layer 32, the reflection surface 24, and the connection of the side wall portion 8 and the cover 10 are the same as the case in the connecting structure of the side wall portion according to the first embodiment, further descriptions will be omitted.

As described above, providing the recess T on at least one of the upper surface of the substrate 4 and the lower surface of the side wall portion 8 adjacent to the connecting portion S may suppress junction inhibition due to dust even if dust exists in the recess T, so that firm connection may be achieved.

In addition, the recessed amount of the recess T provided in the side wall portion 8 or the substrate 4 is preferably 1 μm or more and 20 μm or less. Setting the recessed amount of the recess within this range may suppress the junction inhibition due to dust on the recess T.

It should be noted that if the outer surface 8F of the side wall portion 8 is inclined, it is preferable to provide a recess in a region corresponding to the inclined surface on the lower surface side of the side wall portion 8.

(Method for Manufacturing Light Source Device According to an Embodiment)

Next, with reference to FIGS. 7A to 7E, an example of a method for manufacturing the light source device according to an embodiment described above is shown. FIGS. 7A to 7E are schematic views showing respective steps in one example of a method for manufacturing a light source device having a connecting structure of a side wall portion according to the first embodiment of the present invention. In FIGS. 7A to 7E, the case where the light source device has the connecting structure of the side wall portion according to the first embodiment shown in FIG. 5 will be described as an example, but the light source device may be manufactured similarly also in the case of the connecting structure of the side wall portion according to the second embodiment shown in FIG. 6.

Figure 7A:
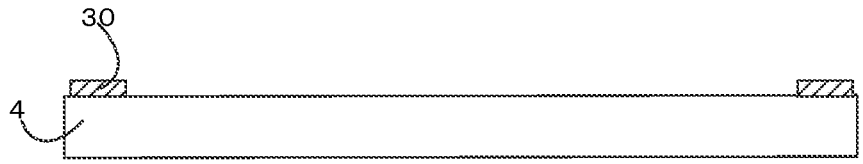
FIG. 7A is a schematic view showing a step in an example of a method for manufacturing a light source device having a connecting structure of a side wall portion according to the first embodiment of the present invention.

As shown in FIG. 7A, a substrate 4 in which a wiring layer is formed by patterning on a substrate made of silicon and which includes a wiring layer electrically connected to a positive electrode and a negative electrode of a semiconductor laser is prepared. Then, a mask is applied to a region, excluding the attachment region of the side wall portion 8, on the upper surface 4A of the substrate 4, a first layer made of a film containing titanium (Ti) is formed by sputtering or vapor deposition, a second layer made of a film containing platinum (Pt) is laminated on the first layer, and a third layer made of a film containing gold (Au) is laminated on the second layer. Thus, the first connecting layer 30 composed of the layer formed of the first layer and the second layer, and the third layer being a connecting layer may be formed.

However, the present disclosure is not limited to the above process, and it is also possible to form only the third layer made of a film containing gold (Au) on the first layer by sputtering or vapor deposition without forming the second layer. In addition, as a forming method, not only sputtering or vapor deposition, but also a method such as plating or printing may be used.

Figure 7B:
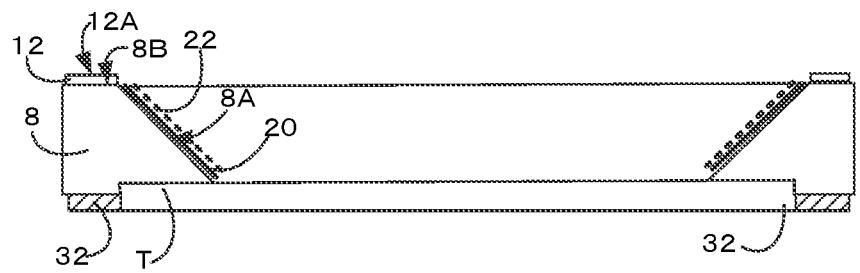
FIG. 7B is a schematic view showing a step in an example of a method for manufacturing a light source device having a connecting structure of a side wall portion according to the first embodiment of the present invention.

Next, as shown in FIG. 7B, a side wall portion 8 including an inclined surface 8A being inclined is prepared by anisotropic etching of silicon. In this case, in the four inclined surfaces 8A, the silicon should preferably be cut out so that the upper surface 8B and the lower surface 8C of the side wall portion 8 form an angle of 9.7° with respect to the <100> plane, whereby the plane plane) on which the beam emitted from the semiconductor laser is directly incident forms an angle of 45° with respect to the upper surface of the substrate 4. Thus, since a reflection surface having an inclination angle of exactly 45° with respect to the upper surface 4A of the substrate 4 is obtained, the beam emitted from the semiconductor laser 6 may be reflected in the direction accurately perpendicular to the upper surface 4A of the substrate 4.

It should be noted that the inclined surface may be formed by a method other than anisotropic etching. In addition, a recess T is formed on the lower surface side of the side wall portion 8. Then, a mask is applied to a region excluding the inclined surface 8A of the side wall portion 8, a first layer made of a film containing titanium (Ti) is formed by sputtering or vapor deposition, a second layer made of a film containing platinum (Pt) is laminated on the first layer, and a third layer made of a film containing silver (Ag) is laminated on the second layer. Thus, the first reflection film (metal film) 20 formed of a layer made of the first layer and the second layer, and the third layer being a reflection layer may be formed.

However, the present disclosure is not limited to the above process, and it is also possible to form only the third layer made of a film containing silver (Ag) on the first layer by sputtering or vapor deposition without forming the second layer.

Furthermore, a dielectric film is formed on the first reflection film (metal film) 20 by sputtering or vapor deposition. Thus, the second reflection film (dielectric film) 22 for improving the reflectance may be formed on the first reflection film (metal film) 20 formed on the inclined surface 8A of the side wall portion 8.

Subsequently, as shown in FIG. 7B, a mask is applied to a region excluding the lower surface 8C of the side wall portion 8 serving as the connecting surface with the substrate 4, a first layer made of a film containing titanium (Ti) is formed by sputtering or vapor deposition, a second layer made of a film containing platinum (Pt) is laminated on the first layer, and a third layer made of a film containing gold (Au) is laminated on the second layer. The second connecting layer 32 formed of a layer made of the first layer and the second layer, and the third layer being a connecting layer may be formed.

However, the present disclosure is not limited to the above process, and it is also possible to form only the third layer made of a film containing gold (Au) on the first layer by sputtering or vapor deposition without forming the second layer.

Furthermore, a mask is applied to a region excluding the forming region of the connecting layer 12 on the upper surface 8B of the side wall portion 8, and the connecting layer 12 made of aluminum or an aluminum alloy is formed by sputtering or vapor deposition. Thus, the connecting layer 12 may be formed on the upper surface 8B of the side wall portion 8.

However, the present disclosure is not limited to the above process, and similarly to the manufacturing process of the connecting layers 30 and 32, after the first layer is formed on the upper surface 8B of the side wall portion 8, the connecting layer 12 may be formed on the first layer.

Figure 7C:
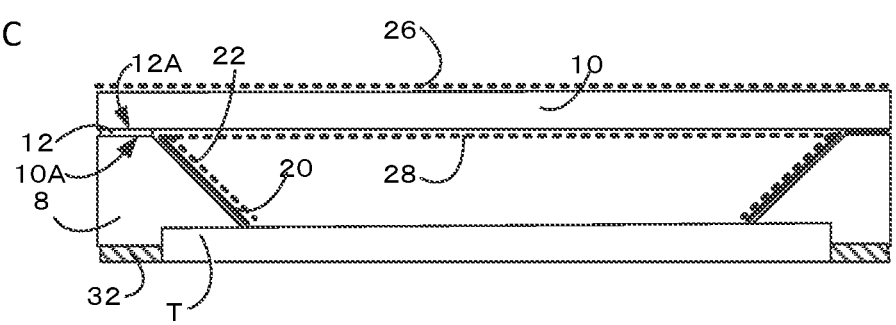
FIG. 7C is a schematic view showing a step in one example of a method for manufacturing a light source device having a connecting structure of a side wall portion according to the first embodiment of the present invention.

Furthermore, as shown in FIG. 7C, a cover 10 made of glass is prepared and an antireflection film (dielectric film) 26 is formed on the upper surface 10B of the cover 10 by sputtering or vapor deposition. Furthermore, an antireflection film (dielectric film) 28 is formed on the lower surface 10A of the cover 10 by sputtering or vapor deposition in a region excluding the region facing the upper surface 8B of the side wall portion 8.

Then, performing anodic bonding between the side wall portion 8 and the cover by heating the upper surface 12A of the connecting layer 12 formed on the side wall portion 8 and the lower surface 10A of the cover 10 with keeping the both surfaces in contact with each other and applying a predetermined voltage thereto with the connecting layer 12 side performing as an anode. Thus, a connecting structure with high airtightness of the connecting layer 12 and the cover 10 may be obtained.

It should be noted that in FIGS. 7A to 7E, a method for manufacturing one light source device is shown, but the light source device may be manufactured with a plurality of substrates 4 and side wall portions 8 connected to each other, and then divided in an appropriate process. Thus, a plurality of light source devices may be efficiently manufactured. In this case, as shown in FIG. 7A, a region where the first connecting layer 30 is not formed is provided within a certain range from the end portion of the upper surface 4A of the substrate 4. Similarly, as shown in FIG. 7C, a region where the second connecting layer 32 is not formed is provided within a certain range from the end portion of the lower surface 8C of the side wall portion 8, and a region where the connecting layer 12 is not formed is provided within a certain range from the end portion of the upper surface 8B of the side wall portion 8. This is provided so as to prevent the first connecting layer 30, the second connecting layer 32, and the connecting layer 12, which are metal patterns, from being damaged by dicing or the like in the subsequent singulating process.

Figure 7D:
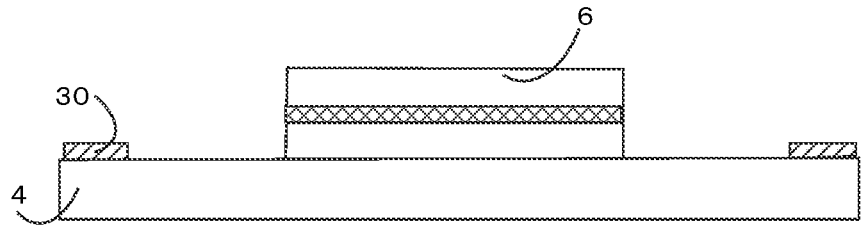
FIG. 7D is a schematic view showing a step in one example of a method for manufacturing a light source device having a connecting structure of a side wall portion according to the first embodiment of the present invention.

Next, as shown in FIG. 7D, the semiconductor laser 6 is mounted on the substrate 4 of this package. An example of a mounting method includes connecting the n-electrode on the bottom surface side of the semiconductor laser 6 and the wiring layer provided on the substrate 4 via a bonding member such as a bump, and wire-bonding the p-electrode on the upper surface side of the semiconductor laser 6 and the wiring layer provided on the substrate 4. In addition, as another example, both the n-electrode and the p-electrode and the wiring layer may be connected to each other via a bonding member by using the semiconductor laser 6 including the n-electrode and the p-electrode on the same surface side.

In addition, the semiconductor laser 6 may also be mounted on the substrate 4 via a sub-mount. The sub-mount is typically a material with high electrical insulating properties and high thermal conductivity. Examples thereof include aluminum nitride and silicon carbide.

Figure 7E:
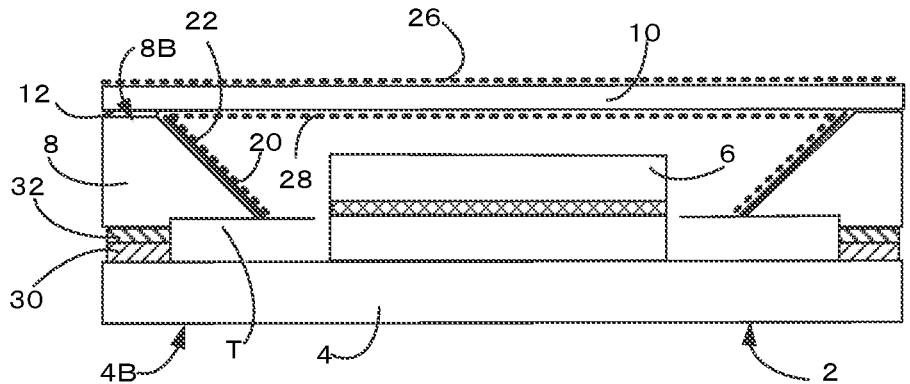
FIG. 7E is a schematic view showing a step in one example of a method for manufacturing a light source device having a connecting structure of a side wall portion according to the first embodiment of the present invention.

Next, as shown in FIG. 7E, connecting the third layer (connecting layer) of the first connecting layer 30 and the third layer (connecting layer) of the second connecting layer 32 by solid phase diffusion connection of gold (Au) and gold (Au) by heating the connecting surface of the first connecting layer 30 formed on the substrate 4 and the connecting surface of the second connecting layer 32 formed on the lower surface of the side wall portion 8 with keeping the both surfaces in contact with each other and applying a compressive load from the lower surface 4B side of the substrate 4 and the upper surface 8B side of the side wall portion 8 via the cover 10. As a compressive load per unit area applied for solid phase diffusion connection, 20 to 40 MPa may be exemplified. However, the present disclosure is not limited thereto, and any compressive load may be applied depending on the size of the contact portion and the type of the bonding metal.

With the manufacturing process as described above, a light source device 2 in which the semiconductor laser 6 is hermetically sealed within the package as shown in FIG. 1 may be manufactured.

It should be noted that the step shown in FIG. 7D may be performed at any timing separately from the steps in FIGS. 7B and 7C as long as the step shown in FIG. 7D is after the step shown in FIG. 7A and before the step shown in FIG. 7E. Furthermore, the order of each step of the above manufacturing processes may be optionally changed. At this time, in order to prevent the material of the preceding process from melting in the later process, it is preferable to determine the order of each step so that a material with a higher melting point is attached in an earlier process.

In the above embodiments, the case of connecting the substrate and the side wall portion by solid phase diffusion connection is described as an example, but the present disclosure is not limited thereto, and even in the case of connecting the first connecting layer and the second connecting layer via a bonding member such as AuSn, compression (for example, compressive load of 1.5 MPa or more) may be applied from the lower surface side of the substrate and the upper surface side of the side wall portion. Therefore, also in the light source device using the connection method other than the solid phase diffusion connection, the connecting structure of the side wall portion according to the above embodiments may be effectively applied.

In the above embodiments, the connecting layer 12 and the cover 10 are connected by using anodic bonding, but the present disclosure is not limited thereto, and other connection means such as welding, soldering, and bonding may be used. In this case, as the material of the connecting layer 12, a metal material other than aluminum or titanium, a resin material, or a ceramic material may be used.

In addition, a photodiode or a Zener diode may be stored in the recess in which the semiconductor laser 6 is stored.

The embodiments and aspects of the present disclosure have been described, but the disclosure content may vary in details of the configuration, and the combinations of elements and changes in order in the embodiments and aspects may be achieved without departing from the scope and spirit of the present disclosure.

What is claimed is:
1. A light source device comprising:
a substrate;
a semiconductor laser placed on the substrate;
a side wall portion formed so as to surround the semiconductor laser; and
a cover being translucent, configured to cover a space surrounded by the substrate and the side wall portion, wherein
the side wall portion includes a lower surface connected to an upper surface of the substrate over a whole periphery, an upper surface connected to a lower surface of the cover over a whole periphery, and inner side surfaces inclined so that the space expands from a lower surface side to an upper surface side of the side wall portion, at least a part of the inner side surfaces serving as a reflection surface for reflecting a beam emitted from the semiconductor laser toward the cover,
a connecting portion where the upper surface of the substrate and the lower surface of the side wall portion are in contact with each other via a connecting layer is provided in a region corresponding to the upper surface of the side wall portion in a plan view from above, and adjacent to the connecting portion,
a recess is provided on at least one of the upper surface of the substrate and the lower surface of the side wall portion.

2. The light source device according to claim 1, wherein in a plan view from above, assuming that a distance between an end portion on a side of the inner side surfaces of the connecting portion and an end portion on a side of the inner side surfaces of a region where the upper surface of the side wall portion is positioned is L, and assuming that a height of the side wall portion is H1, a relationship of L/H1≤0.4 is satisfied.

3. The light source device according to claim 2, wherein the connecting portion is provided only in a region where the upper surface of the side wall portion is positioned in a plan view from above.

4. The light source device according to claim 1, wherein the connecting layer is formed of a metal material, and the upper surface of the substrate and the lower surface of the side wall portion are connected by solid phase diffusion connection.

5. The light source device according to claim 1, wherein the recess is provided on the lower surface of the side wall portion.

6. The light source device according to claim 1, wherein a recessed amount of the recess is 1 μm or more and 20 μm or less.

7. The light source device according to claim 1, comprising a plurality of semiconductor lasers.

8. The light source device according to claim 1, wherein the side wall portion is formed of silicon.

9. The light source device according to claim 8, wherein the inclination angle of an inner side surface on which a beam emitted from the semiconductor laser is directly incident with respect to the upper surface of the substrate is different from an inclination angle of another inner side surface with respect to the upper surface of the substrate.

10. The light source device according to claim 1, wherein the substrate is formed of a ceramic material.

11. The light source device according to claim 1, wherein the inner side surface serving as the reflection surface is a <111> plane of single crystal silicon.

12. The light source device according to claim 1, wherein translucent glass is used as the material of the cover.

13. The light source device according to claim 1, wherein a reflection film containing silver (Ag) is formed on the reflection surface.

14. The light source device according to claim 1, wherein a reflection film containing aluminum (Al) is formed on the reflection surface.

15. The light source device according to claim 1, wherein a dielectric film is formed on the reflection surface.

16. The light source device according to claim 1, wherein a dielectric film is formed on the lower surface of the cover.

17. The light source device according to claim 4, wherein the metal material contains at least one of titanium (Ti), nickel (Ni), chromium (Cr), platinum (Pt) and gold (Au).

18. The light source device according to claim 4, wherein the metal material contains any one of titanium (Ti), nickel (Ni), chromium (Cr), platinum (Pt) and gold (Au).

* * * * *